(12) United States Patent
Tatsumi et al.

(10) Patent No.: US 6,509,645 B2
(45) Date of Patent: *Jan. 21, 2003

(54) SPHERICAL SEMICONDUCTOR DEVICE AND METHOD FOR FABRICATING THE SAME

(75) Inventors: Kohei Tatsumi, Chiba (JP); Kenji Shimokawa, Chiba (JP); Eiji Hashino, Chiba (JP); Nobuo Takeda, Chiba (JP); Atsuyuki Fukano, Chiba (JP)

(73) Assignees: Nippon Steel Corporation, Tokyo (JP); Ball Semiconductor Corporation, Chiba (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/350,125

(22) Filed: Jul. 9, 1999

(65) Prior Publication Data

US 2002/0011665 A1 Jan. 31, 2002

(30) Foreign Application Priority Data

Jul. 9, 1998 (JP) .......................... 10-210442
Jul. 9, 1998 (JP) .......................... 10-210443

(51) Int. Cl.$^7$ .................... H01L 23/48; H01L 23/52; H01L 29/40
(52) U.S. Cl. .................. 257/738; 257/737; 257/780; 257/781; 257/784; 257/785; 257/786; 257/750; 257/690; 257/618
(58) Field of Search ................... 257/737–738, 257/750, 780–781, 785, 618, 772

(56) References Cited

U.S. PATENT DOCUMENTS

| | | | | |
|---|---|---|---|---|
| 5,290,732 A | * | 3/1994 | Kumar et al. | 437/183 |
| 5,736,790 A | * | 4/1998 | Iyogi et al. | 257/780 |
| 5,761,048 A | * | 6/1998 | Trabucco | 361/760 |
| 5,803,340 A | * | 9/1998 | Yeh et al. | 228/56.3 |
| 5,877,943 A | * | 3/1999 | Ramamurhi | 361/783 |
| 5,955,776 A | * | 9/1999 | Ishikawa | 257/618 |
| 6,093,972 A | * | 7/2000 | Carney et al. | 257/790 |
| 6,178,654 B1 | * | 1/2001 | Kanatake | 33/645 |
| 6,204,545 B1 | * | 3/2001 | Nakata | 257/459 |
| 6,245,630 B1 | * | 6/2001 | Ishikawa | 438/393 |

FOREIGN PATENT DOCUMENTS

| | | | | |
|---|---|---|---|---|
| JP | 860207097 | * | 3/1988 | 21/66 |

OTHER PUBLICATIONS

"Nikkei Microdevices publication", Japan, Jul. 1, 1998.

* cited by examiner

*Primary Examiner*—Tom Thomas
*Assistant Examiner*—Nitin Parekh
(74) *Attorney, Agent, or Firm*—Connolly Bove Lodge & Hutz LLP; Larry J. Hume

(57) ABSTRACT

A spherical semiconductor device includes a spherical semiconductor element having one or more electrodes on its surface. Spherical conductive bumps are formed at the positions of the electrodes. The electrodes are so arranged as to contact a common plane. Spherical bumps constituting a group to be connected to the outside protrude above the spherical semiconductor element such that a predetermined gap is formed between a plane or a spherical surface capable of contacting the spherical bumps and the surface of the spherical semiconductor element. The spherical semiconductor device is connected to various circuit boards or another semiconductor device through the spherical bumps. This affords easy and accurate electrical connections to the outside.

1 Claim, 11 Drawing Sheets

SPHERICAL SEMICONDUCTOR DEVICE AND METHOD FOR FABRICATING THE SAME

BACKGROUND OF THE INVENTION

1. Field of the Invention

The present invention relates to a semiconductor device and, more particularly, to a spherical semiconductor device comprising a spherical semiconductor element having one or more electrodes on its surface. The present invention relates also to a method for fabricating a semiconductor device and, more particularly, to a method for fabricating a spherical semiconductor device comprising a spherical semiconductor element having one or more electrodes on its surface.

2. Description of the Related Art

Recently, instead of conventional semiconductor devices fabricated by forming integrated circuits on silicon wafers, a spherical semiconductor element fabricated by forming an electric circuit on the surface of spherical silicon has been developed. This spherical semiconductor element has one or more electrodes on its surface. A semiconductor device having a variety of functions can be realized by combining spherical semiconductor elements having various functions.

Such a spherical semiconductor element cannot operate only by itself. It requires input/output means for electrical connection to the outside to exchange electrical signals with an external circuit or the like. Although spherical semiconductor elements have excellent functions, effective measures have not been found particularly for packaging.

SUMMARY OF THE INVENTION

It is an object of the present invention to provide a spherical semiconductor device having improved connectivity to the outside.

It is another object of the present invention to provide a method for fabricating a spherical semiconductor device having improved connectivity to the outside.

According to the present invention, a spherical semiconductor device comprises a spherical semiconductor element comprising one or more electrodes on a surface of the element and spherical conductive bumps formed at the positions of the electrodes.

According to an aspect of the present invention, said electrodes are arranged so as to contact a common plane.

According to another aspect of the present invention, the spherical bumps constituting a group to be connected to the outside, protrude above the spherical semiconductor element such that there is formed no gap or a predetermined gap between a plane or a spherical surface capable of contacting the group of spherical bumps, and the surface of the spherical semiconductor element.

According to another aspect of the present invention, each spherical bump is made of a refractory metal having a melting point of not less than 550° C.

According to another aspect of the present invention, each electrode is made of a material selected from the group consisting of aluminum, copper, and an alloy containing at least one of aluminum and copper, and each spherical bump is made of a material selected from the group consisting of gold, platinum, palladium, silver, copper, aluminum, nickel, and an alloy containing at least one of gold, platinum, palladium, silver, copper, aluminum, and nickel.

According to another aspect of the present invention, each spherical bump is made of a low-melting metal having a melting point of not more than 450° C.

According to another aspect of the present invention, each electrode is made of a material selected from the group consisting of aluminum, copper, and an alloy containing at least one of aluminum and copper, and each spherical bump is made of a material selected from the group consisting of lead, tin, indium, bismuth, zinc, an alloy containing at least one of lead, tin, indium, bismuth, and zinc, and an alloy mainly containing one of gold-silicon alloy, gold-tin alloy, and silver-tin alloy.

According to another aspect of the present invention, at least one metal layer selected from the group consisting of titanium, tungsten, titanium-tungsten, nickel, chromium, gold, palladium, copper, and platinum is formed on each electrode.

According to another aspect of the present invention, each electrode is connected through the spherical bump formed thereon, to an electrode of a ceramics substrate, a film carrier, a silicon substrate, a printed circuit board, a lead frame, a semiconductor chip, or a spherical semiconductor element.

According to another aspect of the present invention, each spherical bump is made of a refractory metal and connected through a low-melting metal to an electrode of a ceramics substrate, a film carrier, a silicon substrate, a printed circuit board, a lead frame, a semiconductor chip, or a spherical semiconductor element, and the difference in melting point between the refractory metal and the low-melting metal is not less than 50° C.

According to another aspect of the present invention, each spherical semiconductor element is encapsulated with an encapsulating material.

According to another aspect of the present invention, each electrode has a shape selected from the group of a trapezoid, a polygon having at least five sides, and a circle.

According to another aspect of the present invention, each electrode has an area equivalent to the area of a circle having a diameter not less than 3% of a diameter of the spherical semiconductor element.

According to another aspect of the present invention, each spherical bump is made of a refractory metal coated with a low-melting metal.

According to the present invention, since spherical conductive bumps are formed at the positions of electrodes of a spherical semiconductor element, electrical connections to the outside can be easily and accurately made through the spherical bumps.

In particular, a group of spherical bumps to be connected to the outside are arranged to protrude above the spherical semiconductor element such that a predetermined gap is formed between a plane or a spherical surface capable of contacting the group of spherical bumps and the surface of the spherical semiconductor element. Since the spherical bumps thus protrude above the spherical semiconductor element, extremely superior bump joining properties can be obtained.

In case of melt joining, it can be performed by the wet effect of each bump melted even if there is formed no gap.

The surface of each spherical bump made of a refractory metal is coated with a low-melting metal. By setting the difference in melting point between the refractory and low-melting metals to 50° C. or more, preferably, 100° C. or more, the surface portion can be melted while the core remains solid during joining. So, a certain distance, i.e., a distance not less than the diameter of the core metal can be kept between the junction portions.

Each spherical bump may deform into a shape like a Rugby ball, or unevenly deform at its part, e.g., its junction portion. In order for the spherical bumps surely to protrude beyond an apex of the spherical semiconductor element, two or more layers of bumps may be used.

According to the present invention, since spherical conductive bumps are formed at the positions of electrodes of a spherical semiconductor element, electrical connections to the outside can be easily and accurately made through the spherical bumps. In this case, by arranging the spherical bumps to protrude above the spherical semiconductor element, extremely superior bump joining properties can be obtained. As a result, high reliability can be obtained when a semiconductor device comprising such a spherical semiconductor element is packaged or the like.

According to another aspect of the present invention, a method for fabricating a spherical semiconductor device having spherical bumps on surface electrodes of a spherical semiconductor element, comprises the steps of temporarily arranging conductive balls for forming the spherical bumps, on an arrangement substrate at positions respectively corresponding to said surface electrodes, and transferring the conductive balls onto the surface electrodes to join.

According to another aspect of the present invention, the conductive balls are transferred from the arrangement substrate to the surface electrodes while the position of each of the conductive balls on the arrangement substrate is regulated.

According to another aspect of the present invention, the conductive balls are transferred from the arrangement substrate to the surface electrodes such that a predetermined gap is formed between a surface of the arrangement substrate and a surface of the spherical semiconductor element.

According to another aspect of the present invention, the conductive balls are transferred onto and joined to the surface electrodes by thermo-compression bonding.

According to another aspect of the present invention, the conductive balls are transferred onto and joined to the surface electrodes by melting.

According to another aspect of the present invention, each conductive ball is transferred onto and joined to the corresponding surface electrode after one of the surface electrode and conductive ball is coated with a flux.

According to another aspect of the present invention, conductive balls are arranged on the arrangement substrate to correspond to electrodes of spherical semiconductor elements, and the conductive balls are transferred onto the spherical semiconductor elements at once from the arrangement substrate to form bumps.

The fabrication method according to the present invention uses an arrangement substrate having arrangement holes corresponding to surface electrodes of a spherical semiconductor element. Conductive balls are temporarily arranged on the arrangement substrate and then transferred onto the surface electrodes of the spherical semiconductor element, and thereby the conductive balls and the surface electrodes are brought into contact with each other while they are aligned with each other.

In this case, since the surface of the semiconductor element is spherical, the position of each conductive ball may deviate during the transfer process if it is simply placed on the arrangement substrate for temporary arrangement. In the present invention, therefore, positional regulation is effected when each conductive ball on the arrangement substrate is brought into contact with a corresponding electrode. This affords a proper and reliable transfer operation for the conductive balls.

According to the present invention, in fabricating a semiconductor device comprising such a spherical semiconductor element, conductive balls are temporarily arranged on an arrangement substrate and then transferred onto the surface electrodes of the spherical semiconductor element, and thereby the conductive balls and the surface electrodes are brought into contact with each other while they are aligned with each other. It is, therefore, possible to form spherical bumps of the conductive balls and having excellent characteristics, and realize good electrical connections to an external circuit or the like through the spherical bumps.

DETAILED DESCRIPTION OF THE PREFERRED EMBODIMENTS

Preferred embodiments of the present invention will be described below with reference to the accompanying drawings.

First Embodiment

Figure 1:
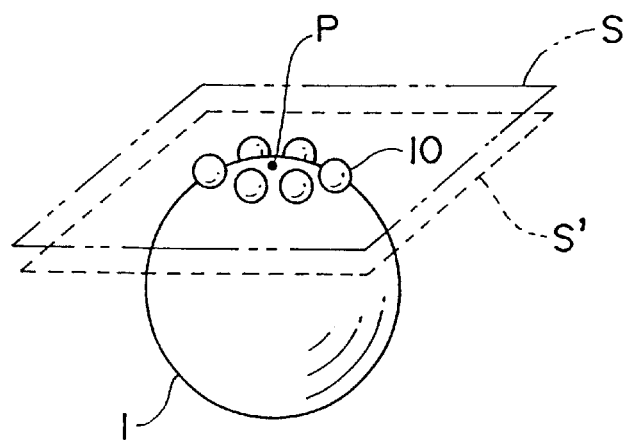
FIG. 1 is a perspective view showing a semiconductor device according to the first embodiment of the present invention.

FIG. 1 shows a semiconductor device according to an embodiment of the present invention. In this embodiment, spherical conductive bumps 10 are formed at the positions of electrodes of a spherical semiconductor element 1.

The spherical semiconductor element 1 is fabricated by forming a desired electric circuit on the surface of a spherical silicon crystal material through fabrication steps. The fabrication steps mainly includes steps of cleaning a crystal material, forming oxide films, forming photoresist films, photolithographing by spherical exposure, patterning by developing, etching, etc. For the circuit formed through these steps, electrodes are formed for electrical connection to the outside. More specifically, an arrangement of electrodes is formed on the spherical surface of the spherical semiconductor element 1.

Referring to FIG. 1, a group of spherical bumps 10 for making connection to the outside are formed on a circumference on the surface of the spherical semiconductor element 1. These spherical bumps 10 are made by the manner of transferring conductive metal balls onto the electrode portions of the spherical semiconductor element 1. These spherical bumps 10 have a common contact plane (that may be spherical) S. These spherical bumps 10 protrude above the spherical semiconductor element 1 such that a predetermined gap is formed between the contact plane S and the surface of the spherical semiconductor element 1.

Figure 2:
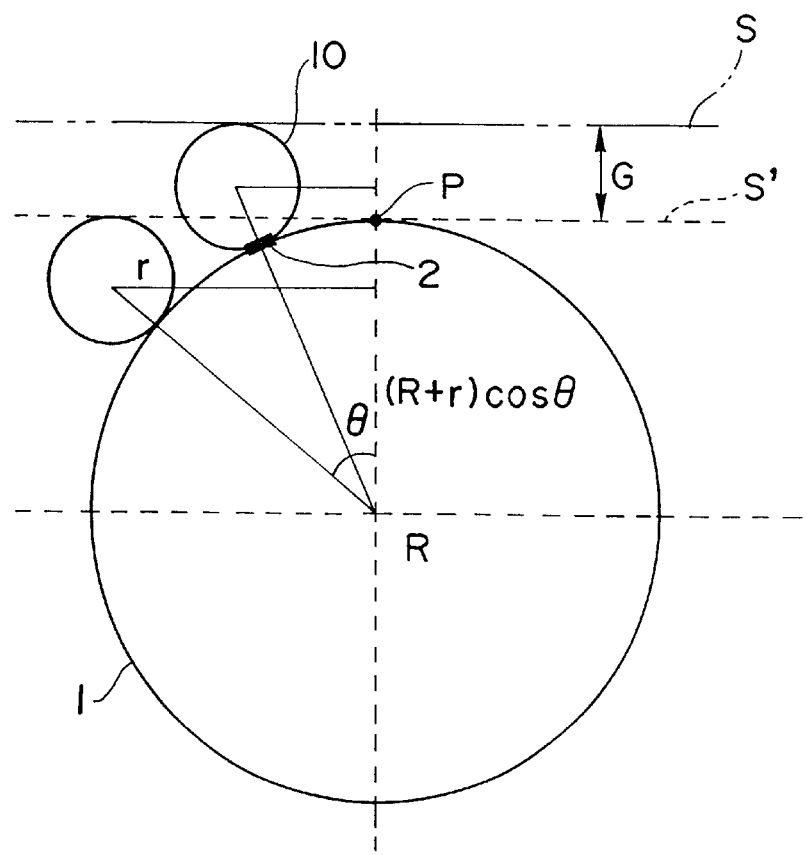
FIG. 2 is a representation for illustrating arrangements of spherical bumps in the semiconductor device according to the first embodiment.

FIG. 2 schematically shows examples of arrangement of spherical bumps 10. Each of the spherical bumps 10 contacting the contact plane S is joined to an electrode 2 formed on the surface of the spherical semiconductor element 1. As shown in FIG. 2, a gap G is formed between the contact surface S and the surface (having an apex P) of the spherical semiconductor element 1. The spherical bumps 10 are disposed to protrude above the spherical semiconductor element 1 and form the gap G. This affords an effective margin for pressure deformation of the spherical bumps 10 when the spherical bumps 10 are pressed onto objects to join, and ensures proper bump joining. Note that bump joining is possible even when no gap is formed between the contact plane S and the surface of the spherical semiconductor element 1, i.e., when G=0.

In another example shown in FIG. 2, no gap is formed between a contact surface S' that includes the apex, P, and the surface of the spherical semiconductor element 1. In this state, however, proper bump joining becomes difficult. So, it is preferable that the level of arrangement of spherical bumps 10 meets the following expression:

$$R-r \leq (r+R)\cos\theta \quad (0 \leq \theta \leq 2\pi)$$

where R represents the radius of the spherical semiconductor element, $r$ does the radius of each spherical bump, and $\theta$ does the angle between the line connecting the centers of the spherical semiconductor element and spherical bump, and the diameter extending through the apex P. The relation between the size $r$ of each spherical bump and the position $\theta$ of the spherical bump is designed in accordance with the size of each electrode on the element surface and the necessary number of electrodes.

The spherical bumps 10 can be formed on the electrodes 2 of the spherical semiconductor element 1 by thermocompression bonding. In this case, each spherical bump 10 is made of a refractory metal material having a melting point preferably of not less than 550° C., more preferably of not less than 600° C. Particularly in case of each electrode 2 made of aluminum or copper, or an alloy containing one or more of those metals, each spherical bump 10 is made of gold, platinum, palladium, silver, copper, aluminum or nickel, or an alloy containing one or more of those metals.

Each spherical bump 10 may deform into a shape like a Rugby ball, or unevenly deform at its part, e.g., its junction portion. In order for the spherical bumps 10 surely to protrude beyond the apex P of the spherical semiconductor element 1, two or more, layers of bumps may be used that are stacked like "dumplings" or "rosary".

Alternatively, the spherical bumps 10 can be formed on the electrodes 2 of the spherical semiconductor element 1 by melting. In this case, each spherical bump 10 is made of a low-melting metal material having a melting point preferably of not more than 450° C., more preferably of not less than 400° C. Particularly in case of each electrode 2 made of aluminum or copper, or an alloy containing one or more of those metals, each spherical bump 10 is made of lead, tin, indium, bismuth or zinc, or an alloy containing one or more of those metals, or an alloy mainly containing gold-silicon alloy, gold-tin alloy, or silver-tin alloy.

In the latter case, one or more metals selected from titanium, tungsten, titanium tungsten, nickel, chromium, gold, palladium, copper, and platinum are preferably formed on each electrode 2 in layers. The electrodes 2 made of aluminum or its alloy show bad wettability to a low-melting metal such as solder. For this reason, such a metal layer or layers as described above are provided on each electrode 2 as underlayer for giving good wettability and preventing diffusion or oxidation.

When the semiconductor device of this embodiment is packaged, its inner electric circuit is connected to an external circuit or the like through the spherical bumps 10 formed as described above. The electrodes 2 are then connected to electrodes of, e.g., a ceramics substrate, a film carrier, a silicon substrate, a printed circuit board, a lead frame, a semiconductor chip, or another spherical semiconductor element. Note that two or more spherical semiconductor elements may be connected to a substrate or the like after being connected to each other.

Figure 3:
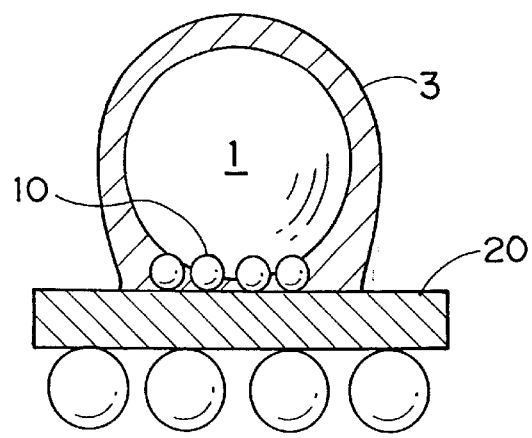
FIG. 3 is a sectional view showing a packaging example of the semiconductor device according to the first embodiment.

FIG. 3 shows an example of a BGA (Ball Grid Arrangement) package using a spherical semiconductor element 1 according to this embodiment. Referring to FIG. 3, each electrode 2 of the spherical semiconductor element 1 is connected to a printed circuit board 20 through the spherical bump 10 formed on the electrode 2. The printed circuit board 20 connected to the spherical semiconductor element 1 is further connected to various electronic devices to exchange electrical signals with those devices. Note that two or more spherical semiconductor elements 1 may be packaged in a single BGA package.

When a semiconductor device according to this embodiment is packaged, its spherical semiconductor element 1 is preferably encapsulated with an encapsulating material 3 as shown in FIG. 3. As the encapsulating material 3, it is preferable to use an insulating material such as a resin or a mold compound containing a resin and filler. With this encapsulation, it is possible to protect the circuit surface of the spherical semiconductor element 1 or effectively to suppress thermal strain resulting from the difference in thermal expansion coefficient between the spherical semiconductor element 1 and the printed circuit board 20 or the like.

Figure 4A:
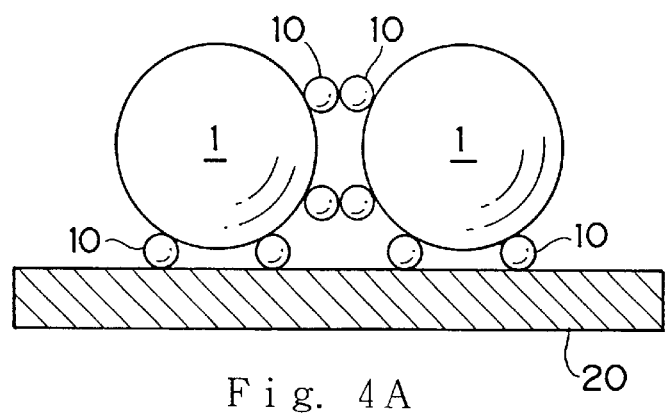
FIGS. 4A and 4B are sectional views showing another packaging example of the semiconductor device according to the first embodiment.
Figure 4B:
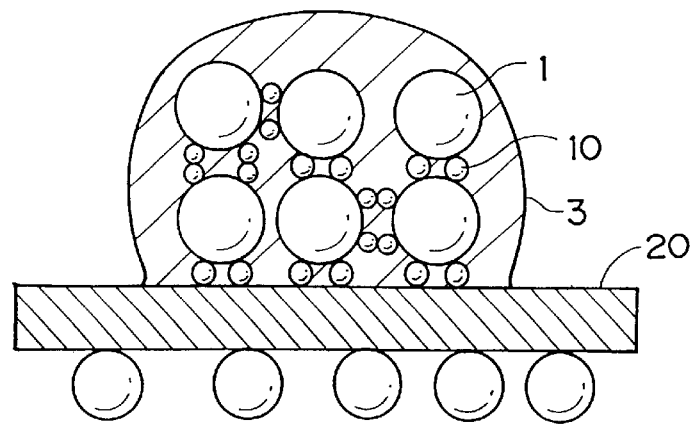

Referring to FIG. 4A, spherical semiconductor elements 1 according to this embodiment are connected to each other through some of spherical bumps 10 formed on their electrodes 2, and mounted on a printed circuit board 20. In this case, such spherical semiconductor elements 1 are preferably encapsulated as a whole with an encapsulating resin 3, as shown in FIG. 4B.

Figure 5:
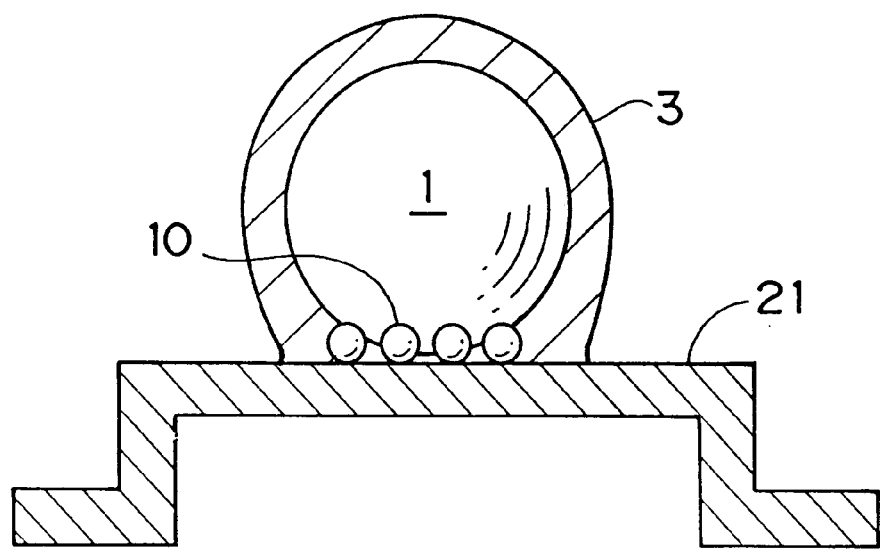
FIG. 5 is a sectional view showing another packaging example of the semiconductor device according to the first embodiment.

FIG. 5 shows an example of a QFP (Quad Flat Package) using a spherical semiconductor element 1 according to this embodiment. Referring to FIG. 5, each electrode 2 of the spherical semiconductor element 1 is connected to a lead frame 21 through the spherical bump 10 formed on the electrode 2. This spherical semiconductor element 1 is also preferably encapsulated with an encapsulating material 3. Also in such a semiconductor device, two or more spherical semiconductor elements 1 may be connected to such a lead frame substrate.

Figure 6:
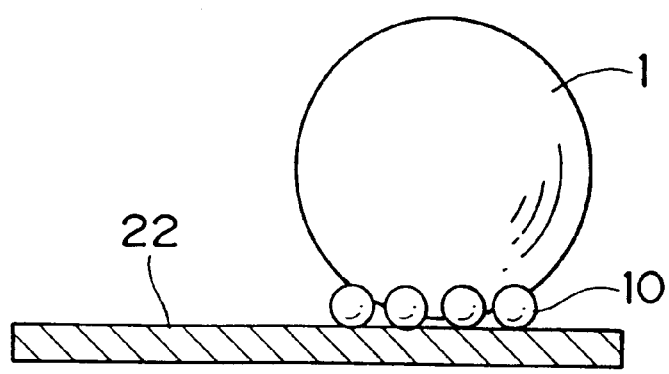
FIG. 6 is a sectional view showing another packaging example of the semiconductor device according to the first embodiment.

FIG. 6 shows another example of packaging for a semiconductor device according to this embodiment. Referring to FIG. 6, each electrode 2 of a spherical semiconductor element 1 for a memory device is connected to a semiconductor chip 22 through the spherical bump 10 formed on the electrode 2.

Figure 7A:
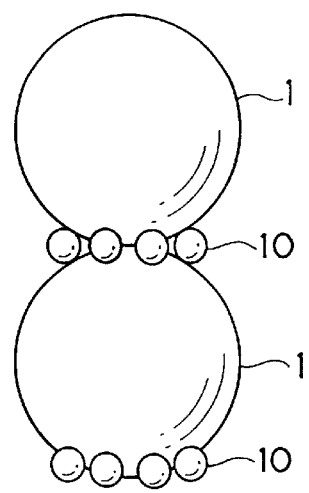
FIGS. 7A to 7C are views showing another packaging example of the semiconductor device according to the first embodiment.

As shown in FIG. 7A, two spherical semiconductor elements 1 according to this embodiment can be connected to each other through spherical bumps 10 of one of them.

Figure 7B:
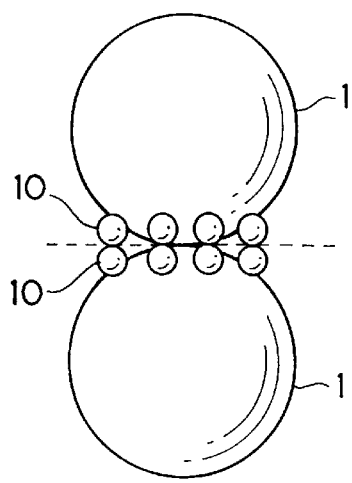
Figure 7C:
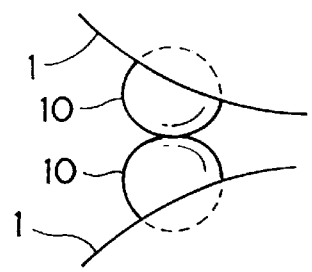

Alternatively, two spherical semiconductor elements 1 according to this embodiment can be connected to each other through spherical bumps 10 of both of them, as shown in FIG. 7B. In this case, the spherical bumps of each couple have been previously joined to each other. Also in this case, each spherical bumps 10 may deform after being pressed, as shown in FIG. 7C.

Figure 8A:
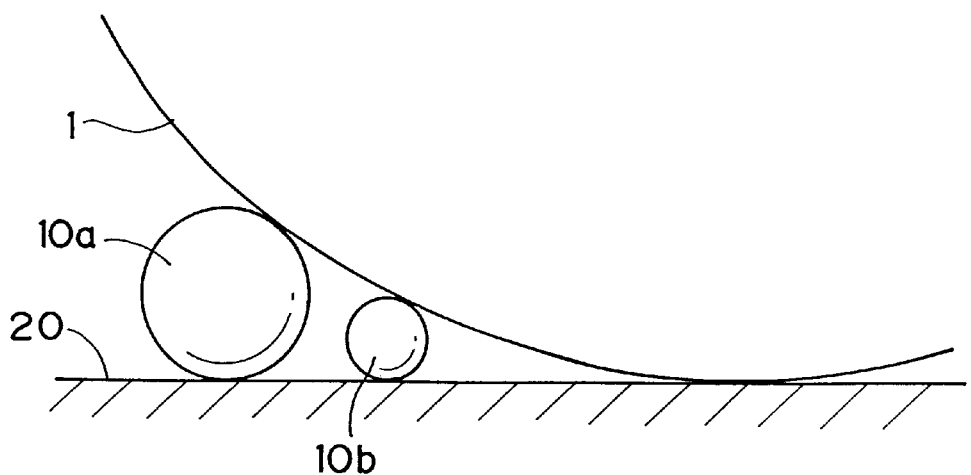
FIGS. 8A to 8C are views showing another packaging example of the semiconductor device according to the first embodiment.
Figure 8B:
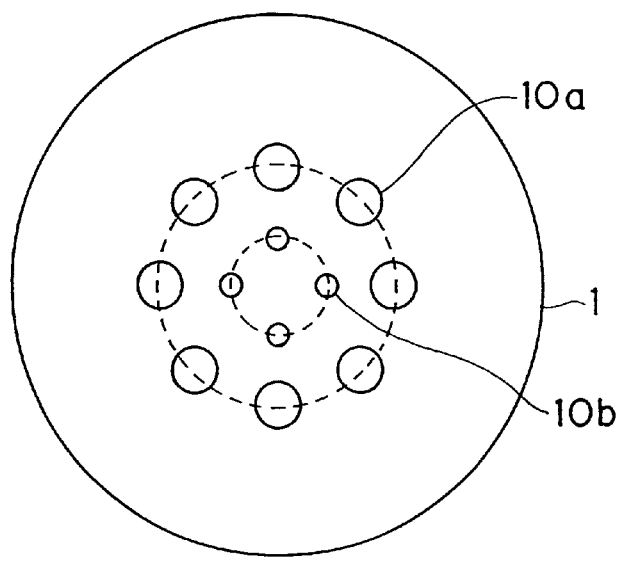
Figure 8C:
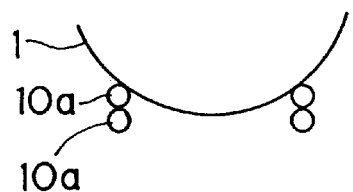

As shown in FIG. 8A, a spherical semiconductor element 1 according to this embodiment can be connected to a junction surface of, e.g., a printed circuit board 20 through spherical bumps 10a and 10b of different sizes. In this case, the spherical bumps 10a and 10b are concentrically arranged on the surface of the spherical semiconductor element 1, as shown in FIG. 8B. As the outer spherical bumps 10a, two or more layers of spherical bumps can be used, as shown in FIG. 8C.

Several examples of semiconductor device of the present invention have been explained together with several typical packaging manners. As described above, a semiconductor device according to the present invention is provided with spherical conductive bumps 10 formed at the positions of the electrodes 2 of each spherical semiconductor element 1. So, electrical connections to the outside can be easily and accurately made through the spherical conductive bumps 10.

Figure 9:
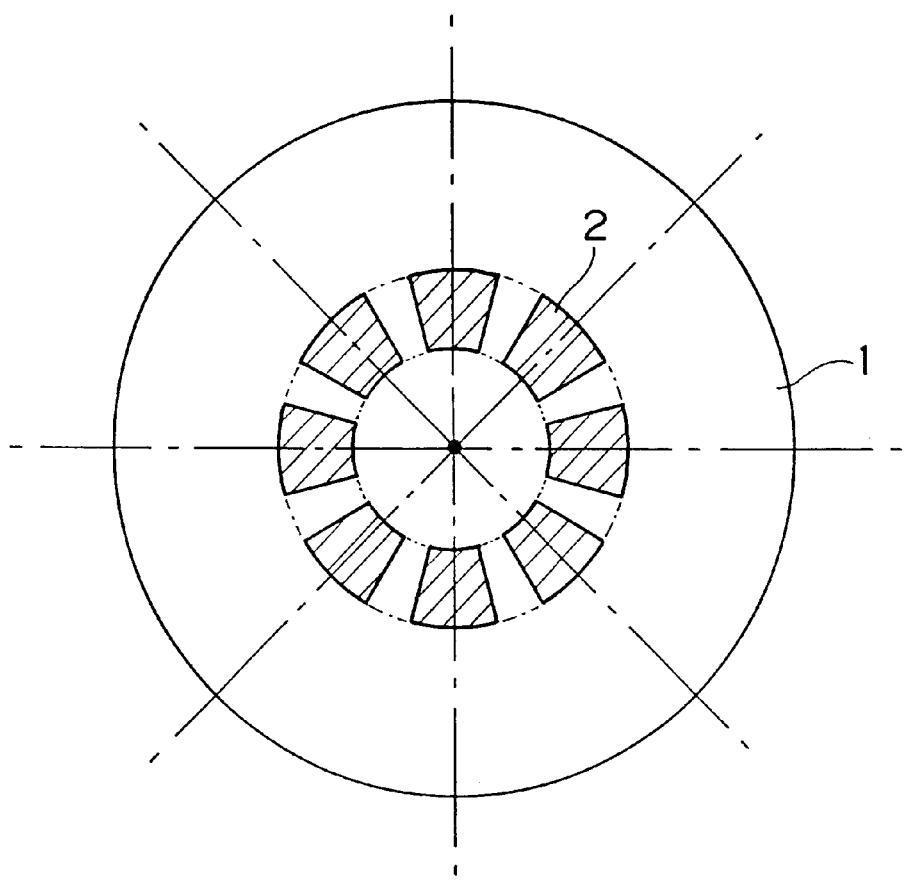
FIG. 9 is a plan view showing an arrangement of electrodes in the semiconductor device according to the first embodiment.

In a spherical semiconductor element 1 according to the present invention, each electrode 2 preferably has a trapezoidal shape or a fan shape. The electrodes 2 constituting one connection group are arranged around a center such that the longer side of each electrode 2 is positioned outside, as shown in FIG. 9. With such an arrangement, peeling resistance to external stress after joining can be increased.

Alternatively, each electrode 2 can be a polygon having five sides or more, or a circle (as plane figure). When the spherical bump 10 on each electrode 2 is pressed onto an object to join, such a shape of the electrode 2 makes it possible uniformly to disperse the load produced between the electrode 2 and spherical bump 10, and so avoid stress concentration. So, the generation of strain or the like during bump joining process can be eliminated, and proper bump joining is ensured.

In a spherical semiconductor element 1 according to the present invention, each electrode 2 preferably has an area equivalent to that of a circle having a diameter which is 3% or more of the diameter of the spherical semiconductor element 1. By thus setting the area of each electrode 2, when the semiconductor device is put into practical use by packaging or the like, it is possible to obtain enough joining strength to resist the pressure load during bump joining process. Proper and good bump joining is ensured also in this respect.

In the above embodiment, a high-melting bump having a melting point of 600° C. or more may be formed on each electrode 2 of a spherical semiconductor element 1 and connected to an electrode of a ceramic substrate, a film carrier, a silicon substrate, a printed circuit board, a lead frame, a semiconductor chip, or another spherical semiconductor element through a low-melting metal having a melting point of 400° C. or less. It may also be possible previously to form a refractory metal bump also on the other electrode to connect, and then to join the refractory metals on both electrodes through a low-melting metal.

Second Embodiment

Next, a fabrication method for a semiconductor device according to an embodiment of the present invention will be described.

Figure 10:
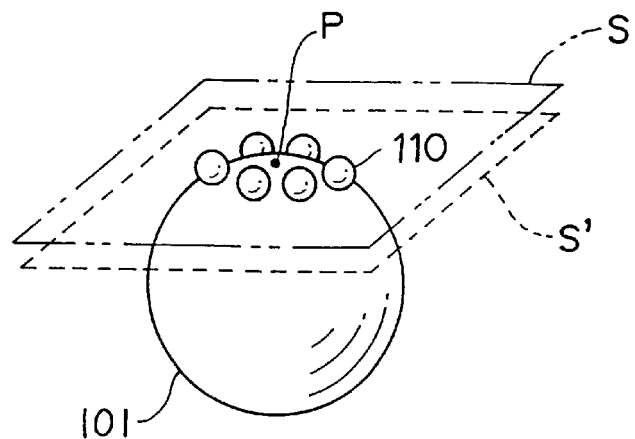
FIG. 10 is a perspective view showing a semiconductor device according to the second embodiment.

FIG. 10 shows a semiconductor device according to an embodiment of the present invention. In this device, spherical conductive bumps 110 are formed at the positions of electrodes of a spherical semiconductor element 101.

The spherical semiconductor element 101 is fabricated by forming a desired electric circuit on the surface of a spherical silicon crystal material through fabrication steps. The fabrication steps mainly includes steps of cleaning a crystal material, forming oxide films, forming photoresist films, photolithographing by spherical exposure, patterning by developing, etching, etc. For the circuit formed through these steps, electrodes are formed for electrical connection to the outside. More specifically, an arrangement of electrodes is formed on the spherical surface of the spherical semiconductor element 101.

Referring to FIG. 10, a group of spherical bumps 110 for making connection to the outside are formed on a circumference on the surface of the spherical semiconductor element 101. These spherical bumps 110 are made by the manner of transferring conductive metal balls onto the electrode portions of the spherical semiconductor element 101. These spherical bumps 110 have a common contact plane (that may be spherical) S. These spherical bumps 110 protrude above the spherical semiconductor element 101 such that a predetermined gap is formed between the contact plane S and the surface of the spherical semiconductor element 101.

Figure 11:
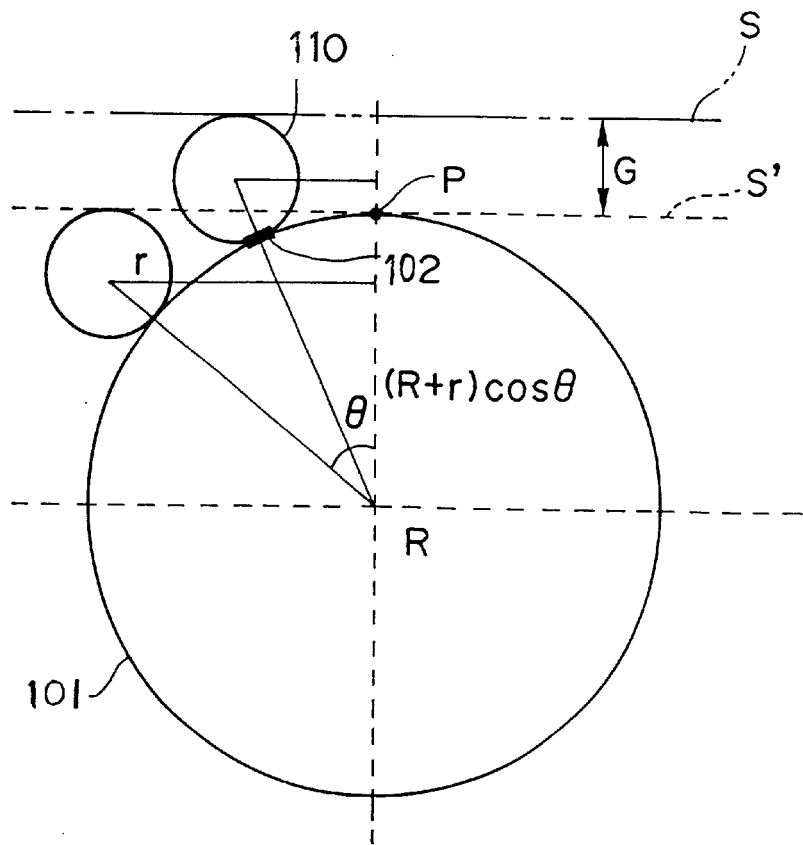
FIG. 11 is a representation for illustrating arrangements of spherical bumps in the semiconductor device according to the second embodiment.

FIG. 11 schematically shows examples of arrangement of spherical bumps 110. Each of the spherical bumps 110 contacting the contact plane S is joined to an electrode 102 formed on the surface of the spherical semiconductor element 101. As shown in FIG. 11, a gap G is formed between the contact surface S and the surface (having an apex P) of the spherical semiconductor element 101. The spherical bumps 110 are disposed to protrude above the spherical semiconductor element 101 and form the gap G. This affords an effective margin for pressure deformation of the spherical bumps 110 when the spherical bumps 110 are pressed onto objects to join, and ensures proper bump joining.

In another example shown in FIG. 11, no gap is formed between a contact surface S' that includes the apex P, and the surface of the spherical semiconductor element 101. In this state, however, proper bump joining becomes difficult. So, it is preferable that the level of arrangement of spherical bumps 110 meets the following expression:

$$R-r \leq (r+R)\cos \theta (0 \leq \theta \leq 2\pi)$$

where R represents the radius of the spherical semiconductor element, $r$ does the radius of each spherical bump, and $\theta$ does the angle between the line connecting the centers of the spherical semiconductor element and spherical bump, and the diameter extending through the apex P.

For fabricating the spherical semiconductor device as described above that has the spherical bumps 110 formed on the electrodes 102 on the spherical semiconductor element 101, an arrangement substrate is used which has holes in the arrangement corresponding to the electrodes 102 on the spherical semiconductor element 101. Conductive metal balls for forming the spherical bumps 110 are temporarily arranged on this arrangement substrate, and then transferred onto the surfaces of the electrodes 102 of the spherical semiconductor element 101 to join.

Figure 12:
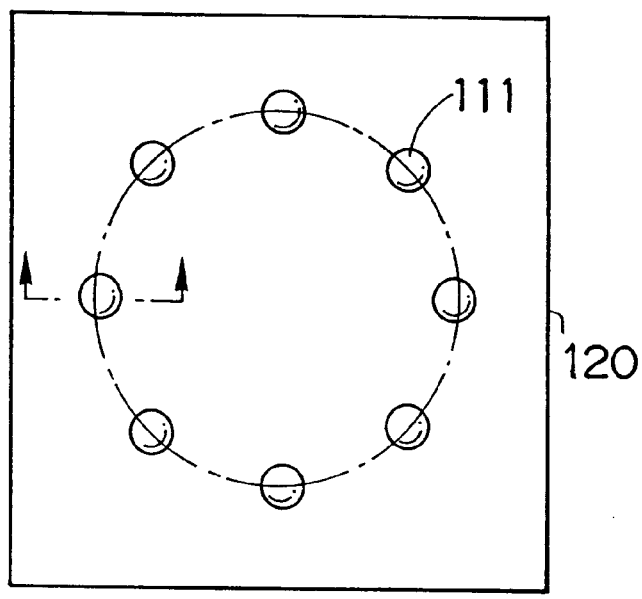
FIG. 12 is a plan view showing the state that metal balls are temporarily arranged on an arrangement substrate in the semiconductor device according to the second embodiment.

FIG. 12 shows the state that the conductive metal balls 111 for forming the spherical bumps 110 are temporarily arranged on the arrangement substrate 120. For forming the spherical bumps 110 arranged on a circumference on the surface of the spherical semiconductor element 101 as shown in FIG. 10, the metal balls 111 are temporarily arranged in the form of a circle as shown in FIG. 12.

Figure 13:
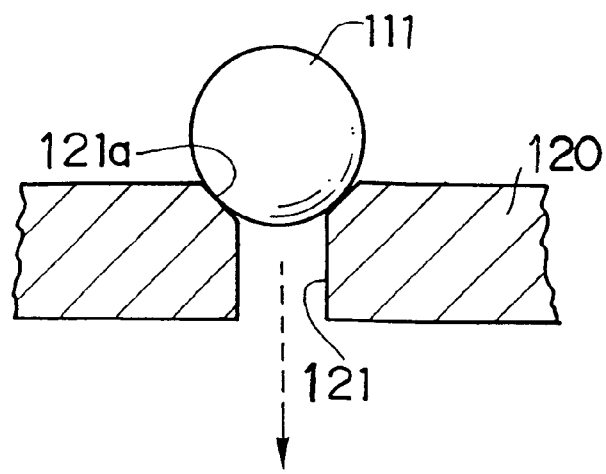
FIG. 13 is a sectional view showing a metal ball temporarily arranged on the arrangement substrate according to the second embodiment shown in FIG. 12.

Referring to FIG. 13, each metal ball 111 is positioned and held by an arrangement hole 121 of the arrangement substrate 120. In this example, each arrangement hole 121 is formed at the position along a circumference corresponding to each electrode 102 on the spherical semiconductor element 101. The arrangement substrate 120 may be a flat plate. An opening portion 121a of each arrangement hole 121 is tapered. This taper makes the metal ball 111 stable, so the metal ball 111 can be accurately positioned and held.

Figure 14:
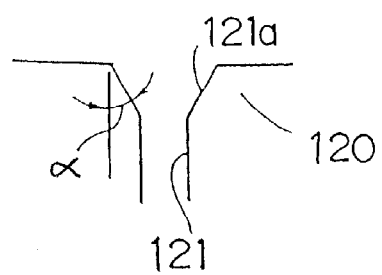
FIG. 14 is a partially enlarged view of an arrangement hole of the arrangement substrate in a fabrication method of the semiconductor device according to the second embodiment.

Referring to FIG. 14, the taper angle at the opening portion 121a of each arrangement hole 121 is designed to be within the range of preferably 10°<<60°, more preferably, 30°-θ<<60°-θ(θ<20°).

An appropriate vacuum source (not shown) may be connected to the arrangement holes 121 of the arrangement substrate 120. With the vacuum source, the metal ball 111 temporarily arranged on each arrangement hole 121 can be drawn by negative pressure, as indicated by the dotted line in FIG. 13, and held on the arrangement hole 121 by the sucking force.

Figure 15:
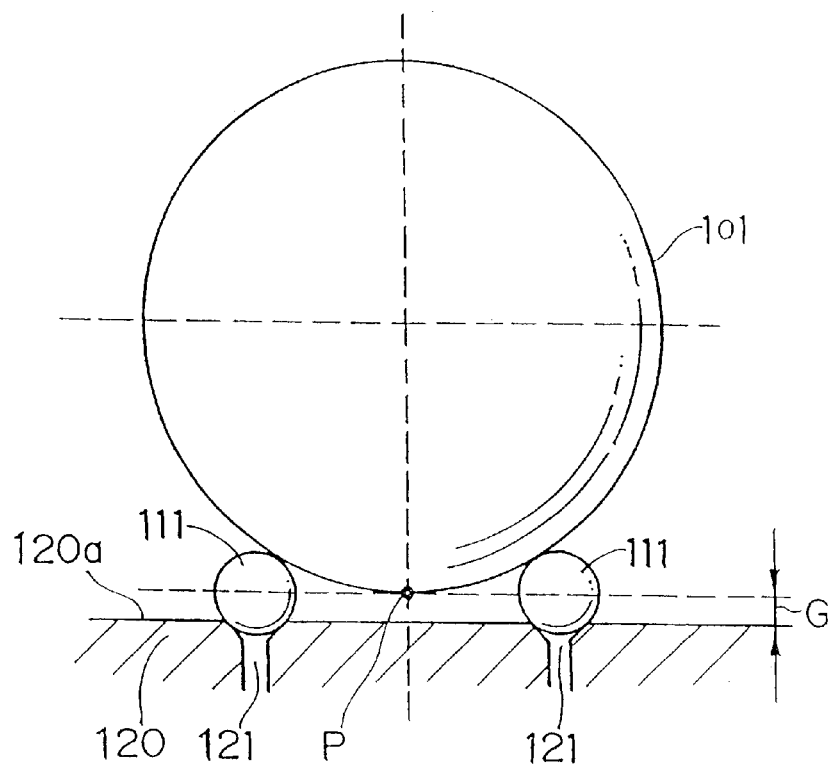
FIG. 15 is a sectional view showing the state that metal balls are transferred in the fabrication method of the semiconductor device according to the second embodiment.

The metal balls 111 can be transferred onto and joined to the surfaces of the electrodes 102 of the spherical semiconductor element 101 by thermo-compression bonding. In FIG. 15, the metal balls 111 are temporarily arranged in the form of a circle on the arrangement substrate 120, as shown in FIG. 12. The spherical semiconductor element 101 is moved down toward the metal balls 111. The metal balls 111 and the electrodes 102 of the spherical semiconductor element 101 are brought into contact with each other while being aligned. The metal balls 111 can be transferred onto and joined to the electrodes 102 by pressing the metal balls 111 against the electrodes 102 with appropriately heating.

The spherical bump 110 is thus formed on each electrode 102 of the spherical semiconductor element 101.

In this example, each metal ball 111 is accurately positioned and held by the tapered opening 121a of the corresponding arrangement hole 121 of the arrangement substrate 120, as shown in FIG. 13. Each metal ball 111 can be properly and reliably transferred onto the corresponding electrode 102 by regulating the position of the metal ball 111 so as to be stable.

The metal balls 111 are transferred such that a gap G is formed between the surface 120a of the arrangement substrate 120 and the lowermost point (the apex P shown in FIG. 11) of the spherical semiconductor element 101. The gap G is determined by geometrical relations such as the arrangement position of the electrodes 102 and the size of the metal balls 111.

When the metal balls 111 are transferred onto and joined to the electrodes 102 of the spherical semiconductor element 101 to form the spherical bumps 110, the metal balls 111 can be drawn onto the arrangement holes 121 by vacuum. In this case, the metal balls 111 can be held on the lower side of the arrangement substrate 111, so the above process can be performed in the reverse vertically positional relation.

The metal balls 111 can be transferred onto and joined to the electrodes 102 of the spherical semiconductor element 101 also by melting. In this case, each electrode 102 of the spherical semiconductor element 101 or each metal ball 111 is preferably coated with a flux. It is because an electrode made of an alloy of, e.g., aluminum shows bad wettability in general to a low-melting metal such as solder. Such flux coating as described above affords good joining properties. Such flux coating is useful also for removing solder oxide films and fixing the metal balls.

When the semiconductor device fabricated as described above is packaged, its inner electric circuit is connected to an external circuit or the like through the spherical bumps 110 formed as described above. The electrodes 102 of the spherical semiconductor element 101 are then connected to electrodes of, e.g., a ceramics substrate, a film carrier, a silicon substrate, a printed circuit board, a lead frame, a semiconductor chip, or another spherical semiconductor element.

Figure 16A:
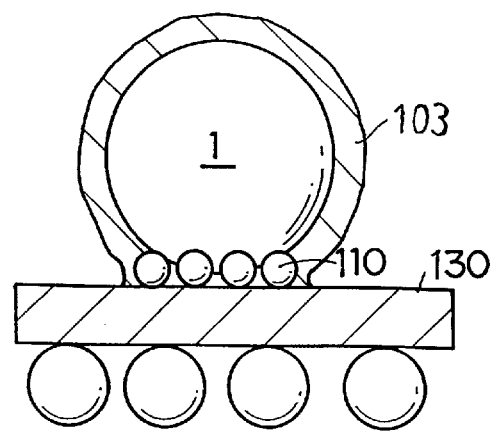
FIGS. 16A and 16B are sectional views showing a packaging example of the semiconductor device according to the second embodiment.

FIG. 16A shows an example of a BGA package using a spherical semiconductor element 101. Referring to FIG. 16A, each electrode 102 of the spherical semiconductor element 101 is connected to a printed circuit board 130 through the spherical bump 110 formed on the electrode 102. The printed circuit board 130 connected to the spherical semiconductor element 101 is further connected to various electronic devices to exchange electrical signals with those devices.

When the semiconductor device fabricated as described above is packaged, its spherical semiconductor element 101 is preferably encapsulated with an encapsulating material 103 as shown in FIG. 16A. As the encapsulating material 103, it is preferable to use an insulating material such as a resin or a mold compound containing a resin and filler. With this encapsulation, it is possible to protect the circuit surface of the spherical semiconductor element 101 or effectively to suppress thermal strain resulting from the difference in thermal expansion coefficient between the spherical semiconductor element 101 and the printed circuit board 130 or the like.

Figure 16B:
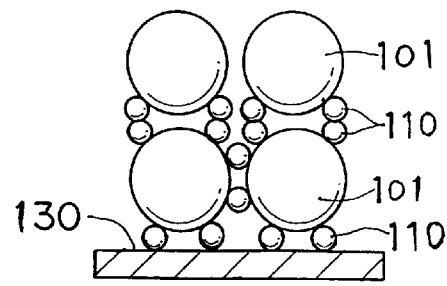

Referring to FIG. 16B, spherical semiconductor elements 101 are connected to each other through some of spherical bumps 110 formed on their electrodes 102, and mounted on a printed circuit board 120. In this case, such spherical semiconductor elements 101 are preferably encapsulated as a whole with an encapsulating resin 103.

Figure 17:
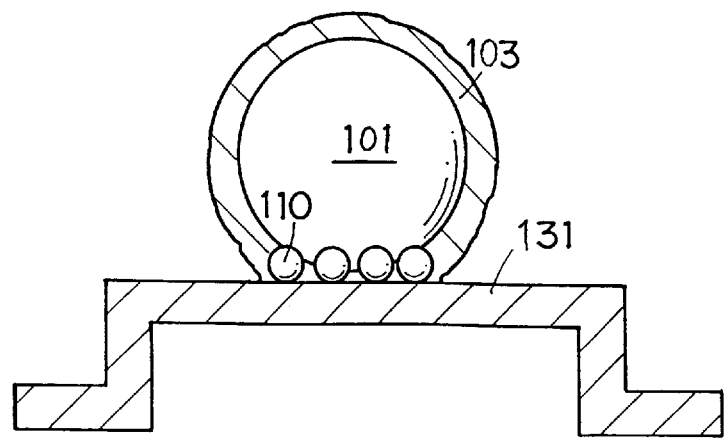
FIG. 17 is a sectional view showing another packaging example of the semiconductor device according to the second embodiment.

FIG. 17 shows an example of a QFP using a spherical semiconductor element 101. Referring to FIG. 17, each electrode 102 of the spherical semiconductor element 101 is connected to a lead frame 131 through the spherical bump 110 formed on the electrode 102. This spherical semiconductor element 101 is also preferably encapsulated with an encapsulating material 103.

Figure 18A:
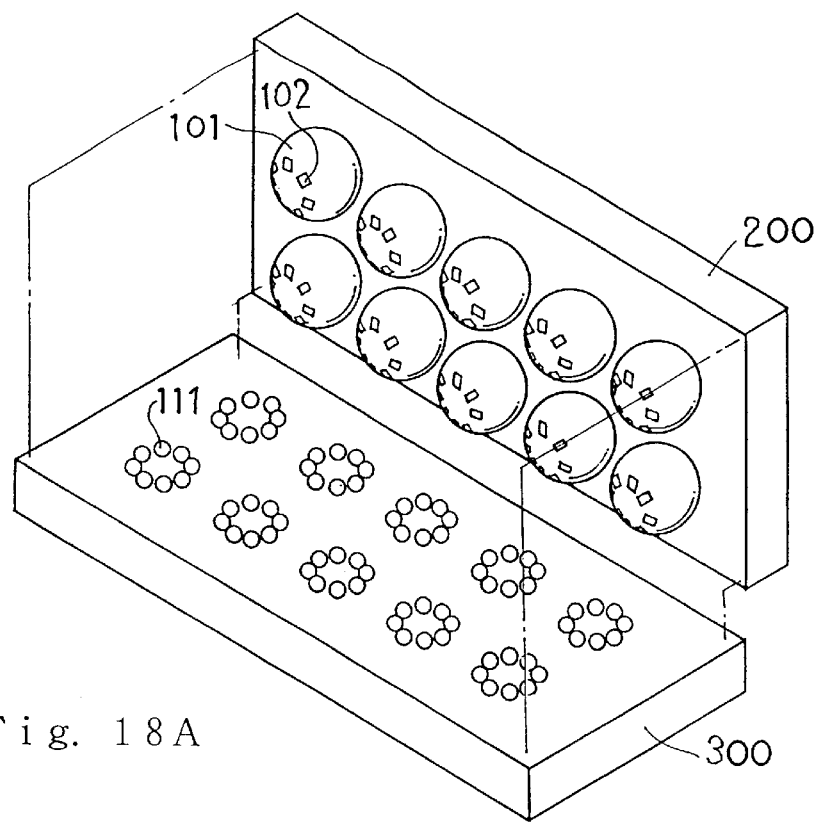
FIGS. 18A and 18B are perspective views showing a construction for transferring metal balls onto spherical semiconductor elements at once in the fabrication method of the semiconductor device according to the second embodiment.
Figure 18B:
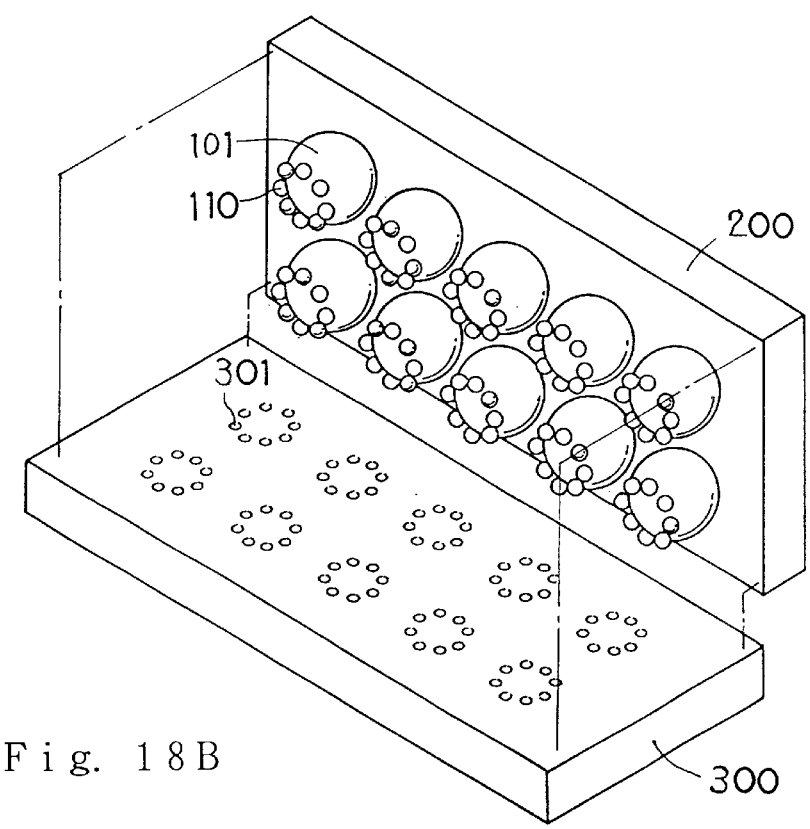

FIGS. 18A and 18B show an example in which spherical bumps 110 are formed onto spherical semiconductor elements 101 at once. In this example, metal balls are arranged on an arrangement substrate so as to correspond to the arrangements of the electrodes of the spherical semiconductor elements, and then the metal balls are transferred onto the electrodes at once. In this manner, groups of metal balls can be transferred at once from one arrangement substrate.

More specifically, spherical semiconductor elements 101 are arranged on a holding substrate 200 such that the electrodes 102 of each spherical semiconductor element 101 face down, as shown in FIG. 18A. Groups of metal balls 111 are temporarily arranged on an arrangement substrate 300 so as to correspond to the spherical semiconductor elements 101. The metal balls 111 are accurately positioned by dimples or recesses 301 (see FIG. 18B) formed on the arrangement substrate 300. While the electrodes 102 and the metal balls 111 are aligned with each other, the holding substrate 200 is overlaid on the arrangement substrate 300.

An appropriate pressure is applied to the layers of the holding substrate 200 and arrangement substrate 300 to transfer the metal balls 111 onto the electrodes 102 and join the former to the latter. After this, the holding substrate 200 is pulled up, as shown in FIG. 18B. A spherical bump 110 is then formed on each electrode 102 of each spherical semiconductor element 101. By forming the bumps on the spherical semiconductor elements 101 at once in this manner, the efficiency of fabricating spherical semiconductor devices can be greatly improved.

In the example described above, the arrangement of the spherical bumps 110 to be formed at the positions of the electrodes 102 of each spherical semiconductor element 101 is not limited to a circle as shown in FIG. 10, but other various arrangements can be employed. In any case, electrical connections to the outside can be easily and accurately made through spherical bumps 110 formed.

What is claimed is:

1. A spherical semiconductor device comprising a spherical semiconductor element, said element comprising:

one or more electrodes on a surface of said element; and spherical conductive bumps formed at the positions of said electrodes by melting;

said electrode made of a material selected from the group consisting of aluminum, copper, and an alloy containing at least one of aluminum and copper, and said spherical bump is made of a low-melting metal having a melting point of not more than 450° C. and selected from the group consisting of lead, tin, indium, bismuth, zinc, an alloy mainly containing one of gold-silicon alloy, gold-tin alloy, and silver-tin alloy; and at least one metal layer selected from the group consisting of titanium, tungsten, titanium-tungsten, nickel, chromium, gold, palladium, copper, and platinum is formed on said electrode;

where the radii of the bump and the element are related by the expression $$R-r \leq (r+R)\cos \theta (0 \leq \theta \leq 2\pi)$$

where R represents a radius of said spherical conductive element, r is a radius of a spherical conductive bump, and θ is an angle between the straight line extending through the centers of said spherical conductive element and said spherical conductive bump and the straight line extending through an apex of said spherical conductive element.

* * * * *